United States Patent
Tsai et al.

(10) Patent No.: US 11,430,783 B2
(45) Date of Patent: Aug. 30, 2022

(54) ELECTROSTATIC DISCHARGE PROTECTION APPARATUS

(71) Applicant: Faraday Technology Corp., Hsinchu (TW)

(72) Inventors: Chia-Ku Tsai, Hsinchu (TW); Tsung-Hsiao Lin, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 334 days.

(21) Appl. No.: 16/745,349

(22) Filed: Jan. 17, 2020

(65) Prior Publication Data

US 2021/0066286 A1 Mar. 4, 2021

(30) Foreign Application Priority Data

Sep. 4, 2019 (TW) ................ 108131968

(51) Int. Cl.
*H01L 27/02* (2006.01)
*H01L 29/861* (2006.01)
*H01L 27/092* (2006.01)

(52) U.S. Cl.
CPC ...... *H01L 27/0266* (2013.01); *H01L 27/0255* (2013.01); *H01L 27/0928* (2013.01); *H01L 29/861* (2013.01)

(58) Field of Classification Search
CPC ............ H01L 27/0266; H01L 27/0255; H01L 27/0928; H01L 29/861; H01L 29/8611; H01L 27/0248; H01L 27/0262; H01L 27/0296
See application file for complete search history.

(56) References Cited

U.S. PATENT DOCUMENTS

| 7,589,944 | B2 | 9/2009 | Mergens et al. |
| 9,368,486 | B2 | 6/2016 | Wang et al. |
| 10,062,682 | B1 * | 8/2018 | Mallikarjunaswamy ............ H01L 29/0649 |
| 2007/0096213 | A1 | 5/2007 | Tsai et al. |
| 2012/0099230 | A1 | 4/2012 | Moon |

(Continued)

FOREIGN PATENT DOCUMENTS

| TW | 200520199 | 6/2005 |
| TW | 201108383 | 3/2011 |

(Continued)

OTHER PUBLICATIONS

"Office Action of Taiwan Counterpart Application", dated Apr. 20, 2020, p. 1-p. 10.

*Primary Examiner* — Selim U Ahmed
(74) *Attorney, Agent, or Firm* — JCIPRNET

(57) ABSTRACT

The electrostatic discharge (ESD) protection apparatus includes a first well, a second well, a first doping region, and a second doping region. The first well is disposed in a substrate having a first conductivity type, wherein the first well has a second conductivity type and the substrate is electrically connected to a first pad. The second well is disposed in the first well, wherein the second well has the first conductivity type. The first doping region is disposed in the second well, wherein the first doping region has the second conductivity type, and the first doping region is electrically connected to a second pad. The second doping region is disposed in the second well, wherein the second doping region has the first conductivity type.

24 Claims, 11 Drawing Sheets

(56) References Cited

U.S. PATENT DOCUMENTS

2014/0159108 A1* 6/2014 Marreiro ............ H01L 27/0248
                                                      257/140
2018/0090482 A1   3/2018 Lee

FOREIGN PATENT DOCUMENTS

TW       201431070       8/2014
TW       201618272       5/2016

* cited by examiner

ELECTROSTATIC DISCHARGE PROTECTION APPARATUS

CROSS-REFERENCE TO RELATED APPLICATION

This application claims the priority benefit of Taiwan application serial no. 108131968, filed on Sep. 4, 2019. The entirety of the above-mentioned patent application is hereby incorporated by reference herein and made a part of this specification.

BACKGROUND

Technical Field

The present disclosure relates to an electronic circuit, and more particularly to an electrostatic discharge (ESD) protection apparatus.

Description of Related Art

In general, an ESD protection component is usually provided in an integrated circuit to protect the internal circuit of the integrated circuit from ESD current. For example, an integrated circuit can instantly discharge a large amount of ESD current by placing an ESD protection component between power rails and a signal pad. When the ESD positive pulse occurs to the signal pad, the ESD protection component can immediately guide the ESD current of the signal pad to the power rail (power pad). When an ESD negative pulse occurs to the signal pad, the ESD protection component can transfer current from the power rail (power pad) to the signal pad.

The information disclosed in this "BACKGROUND OF THE INVENTION" section is only for enhancement of understanding of the background of the described technology and therefore it may contain information that does not form the prior art that is already known to a person of ordinary skill in the art. Further, the information disclosed in the "BACKGROUND OF THE INVENTION" section does not mean that one or more problems to be resolved by one or more embodiments of the invention was acknowledged by a person of ordinary skill in the art.

SUMMARY

The disclosure provides an electrostatic discharge (ESD) protection apparatus for providing ESD protection.

An ESD protection apparatus of the present disclosure includes a first well, a second well, a first doping region, and a second doping region. The first well is disposed in a substrate having a first conductivity type, wherein the first well has a second conductivity type, and the substrate is electrically connected to a first pad. A second well is disposed in the first well, wherein the second well has a first conductivity type. A first doping region is disposed in the second well, wherein the first doping region has a second conductivity type, and the first doping region is electrically connected to the second pad. The second doping region is disposed in the second well, wherein the second doping region has the first conductivity type.

An ESD protection apparatus of the present disclosure includes a silicon-controlled rectifier (SCR), a first ESD protection circuit, and a second ESD protection circuit. The first terminal of the SCR is coupled to the first pad. The second terminal of the SCR is coupled to the second pad. The first terminal of the first ESD protection circuit is coupled to the second terminal of the SCR. The second terminal of the first ESD protection circuit is coupled to the control terminal of the SCR. The first terminal of the second ESD protection circuit is coupled to the control terminal of the SCR. The second terminal of the second ESD protection circuit is coupled to the first pad.

Based on the above, the ESD protection apparatus according to the embodiments of the present disclosure provides a layout structure (ESD protection circuit). The layout structure is embedded with an SCR. When the current of the ESD flows through the first ESD protection circuit (the NP junction in the second well), the SCR is turned on immediately. In that circumstances, the SCR can transfer a large amount of ESD current between the first pad and the second pad. In this way, the ESD protection apparatus can provide ESD protection.

In order to make the aforementioned features and advantages of the disclosure more comprehensible, embodiments accompanying figures are described in detail below.

DESCRIPTION OF THE EMBODIMENTS

Figure 1A:
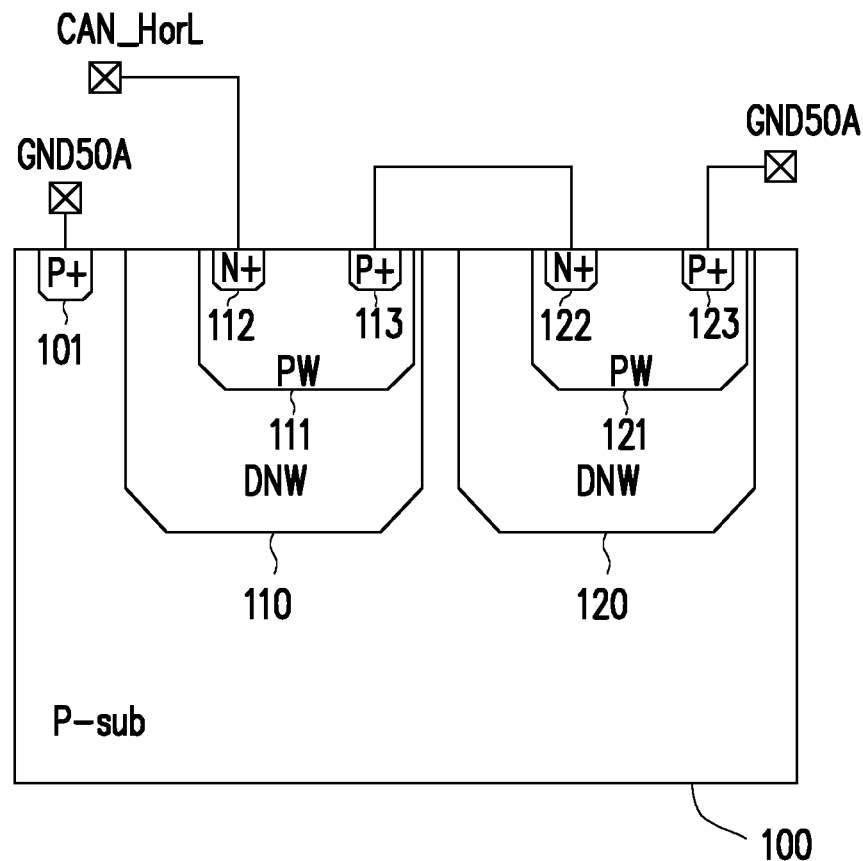
FIG. 1A is a schematic cross-sectional view showing a layout structure of an electrostatic discharge (ESD) protection apparatus according to an embodiment of the disclosure.

A term "couple (or connected)" used in the full text of the disclosure (including the claims) refers to any direct and indirect connections. For instance, if a first device is described to be coupled to a second device, it is interpreted as that the first device is directly coupled to the second device, or the first device is indirectly coupled to the second device through other devices or connection means. The terms "first" and "second" mentioned in the full text of the specification (including the claims) are used to name the elements, or for distinguishing different embodiments or scopes, instead of restricting the upper limit or the lower limit of the numbers of the elements, nor limiting the order of the elements. Moreover, wherever possible, components/members/steps using the same referral numerals in the drawings and description refer to the same or like parts. Components/members/steps using the same referral numerals or using the same terms in different embodiments may cross-refer related descriptions.

FIG. 1A is a schematic cross-sectional view showing a layout structure of an electrostatic discharge (ESD) protection apparatus according to an embodiment of the disclosure. The ESD protection apparatus shown in FIG. 1A includes a first well 110, a second well 111, a doping region 112, and a doping region 113. The first well 110 is disposed in the substrate 100 having the first conductivity type. The electrical connection state of the first well 110 is floating. The first well 110 and the first doping region 112 have the second conductivity type, and the second well 111 and the second doping region 113 have the first conductivity type. The first conductivity type and the second conductivity type may be defined according to design requirements. For example, in the embodiment shown in FIG. 1A, the substrate 100 is a P-type substrate (P-sub), and the first well 110 is a deep doping N-type well (DNW), the second well 111 is a P-type well (PW), the doping region 112 is an N-type doping region, and the doping region 113 is a P-type doping region. In other embodiments, the first conductivity type may be N type, and the second conductivity type may be P type.

The second well 111 is disposed in the first well 110. The doping region 112 and the doping region 113 are disposed in the second well 111. In the embodiment shown in FIG. 1A, the substrate 100 is further provided with a doping region 101. When the substrate 100 is a P-type substrate, the doping region 101 may be a P-type doping region. The doping region 101 is electrically connected to the pad GND50A through metal interconnection, and the doping region 112 is electrically connected to the pad CAN_HorL through metal interconnection. The pad GND50A and the pad CAN_HorL can be defined according to design requirements. For example, the pad GND50A can be a reference voltage pad or a power supply voltage pad, and the pad CAN_HorL can be a signal pad. In other embodiments, the pad GND50A may be one of the reference voltage pad and the power supply voltage pad, and the pad CAN_HorL may be the other one of the reference voltage pad and the power supply voltage pad.

In the embodiment shown in FIG. 1A, the ESD protection apparatus further includes a third well 120, a fourth well 121, a doping region 122, and a doping region 123. The third well 120 is disposed in the substrate 100. The electrical connection state of the third well 120 is floating. The fourth well 121 is disposed in the third well 120. The doping region 122 and the doping region 123 are disposed in the fourth well 121. The doping region 122 is electrically connected to the doping region 113 through metal interconnection. The doping region 123 is electrically connected to the pad GND50A through metal interconnection.

The third well 120 and the doping region 122 have the second conductivity type, and the fourth well 121 and the doping region 123 have the first conductivity type. In the embodiment shown in FIG. 1A, the third well 120 is a deep doping N-type well, and the fourth well 121 is a P-type well, and the doping region 122 is an N-type doping region, and the doping region 123 is a P-type doping region. In other embodiments, the first conductivity type may be N type, and the second conductivity type may be P type.

Figure 1B:
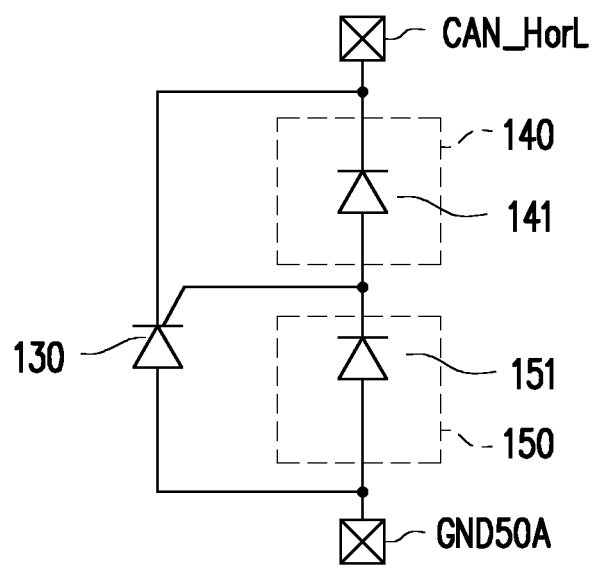
FIG. 1B is a schematic circuit block diagram of an ESD protection apparatus according to an embodiment of the disclosure.

FIG. 1B is a schematic circuit block diagram of an ESD protection apparatus according to an embodiment of the disclosure. The circuit shown in FIG. 1B can be regarded as an equivalent circuit of the layout structure shown in FIG. 1A, and the layout structure shown in FIG. 1A can be regarded as a layout example of the circuit shown in FIG. 1B. The ESD protection apparatus shown in FIG. 1B includes a Silicon-Controlled Rectifier (SCR) 130, an ESD protection circuit 140, and an ESD protection circuit 150. The first terminal (e.g., the anode) of the SCR 130 is coupled to the pad GND50A. The second terminal (e.g., the cathode) of the SCR 130 is coupled to the pad CAN_HorL.

The first terminal of the ESD protection circuit 140 is coupled to the second terminal of the SCR 130. The second terminal of the ESD protection circuit 140 is coupled to a control terminal (e.g., a gate) of the SCR 130. In the embodiment shown in FIG. 1B, the ESD protection circuit 140 includes a diode 141. The cathode of the diode 141 serves as the first terminal of the ESD protection circuit 140. The anode of the diode 141 serves as the second terminal of the ESD protection circuit 140.

The first terminal of the ESD protection circuit 150 is coupled to the control terminal of the SCR 130. The second terminal of the ESD protection circuit 150 is coupled to the pad GND50A. In the embodiment shown in FIG. 1B, the ESD protection circuit 150 includes a diode 151. The cathode of the diode 151 serves as the first terminal of the ESD protection circuit 150. The anode of the diode 151 serves as the second terminal of the ESD protection circuit 150.

Please refer to FIG. 1A and FIG. 1B. The layout structure formed by the doping region 112, the second well 111, the first well 110 and the substrate 100 is embedded with an SCR (corresponding to the SCR 130), wherein the doping region 112 corresponds to the cathode, the second well 111 corresponds to the gate, and the substrate 100 corresponds to the anode. A diode (corresponding to the diode 141) is formed by the doping region 112 and the second well 111, wherein the doping region 112 corresponds to the cathode, and the second well 111 corresponds to the anode. A diode (corresponding to the diode 151) is formed by the doping region 122 and the fourth well 121, wherein the doping region 122 corresponds to the cathode, and the fourth well 121 corresponds to the anode.

As compared with the SCR, the diodes 141 and 151 have a lower trigger voltage. Compared with the diode, the SCR 130 can withstand greater on-current. When the ESD occurs to the pad CAN_HorL, the ESD current flows through the diodes 141 and 151, thereby instantly triggering the SCR 130. When the SCR 130 is turned on, the SCR 130 can transfer a large amount of ESD current between the pad CAN_HorL and the pad GND50A. Therefore, the ESD protection apparatus shown in FIGS. 1A and 1B can provide ESD protection.

Figure 2A:
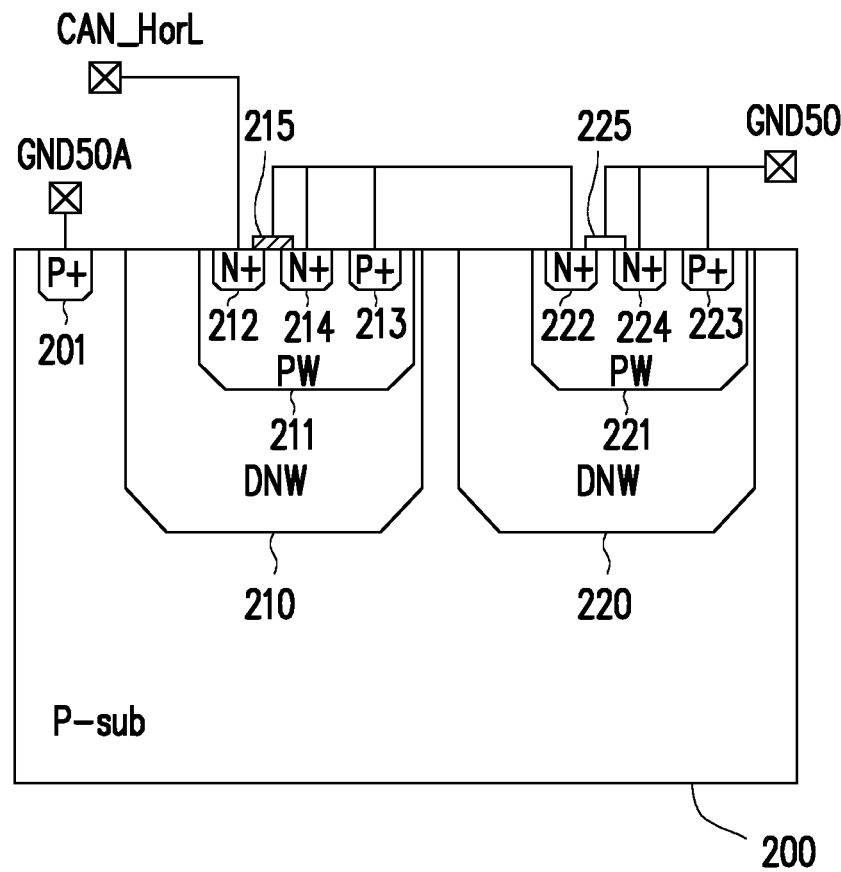
FIG. 2A is a schematic cross-sectional view showing a layout structure of an ESD protection apparatus according to another embodiment of the present disclosure.

FIG. 2A is a schematic cross-sectional view showing a layout structure of an ESD protection apparatus according to another embodiment of the present disclosure. The ESD protection apparatus shown in FIG. 2A includes a substrate 200, a doping region 201, a first well 210, a second well 211, a doping region 212, a doping region 213, a third well 220, a fourth well 221, a doping region 222 and a doping region 223. In FIG. 2A, the substrate 200, the doping region 201, the first well 210, the second well 211, the doping region 212, the doping region 213, the third well 220, the fourth well 221, the doping region 222, and the doping region 223 can be inferred from descriptions of the substrate 100, the doping region 101, the first well 110, the second well 111, the doping region 112, the doping region 113, the third well 120, the fourth well 121, the doping region 122 and the doping region 123 shown in FIG. 1A, so further descriptions are not incorporated herein.

In the embodiment shown in FIG. 2A, the ESD protection apparatus further includes a doping region 214, a gate structure 215, a doping region 224, and a gate structure 225. The doping region 214 is disposed in the second well 211 and disposed adjacent to the doping region 212 but not in contact with the doping region 212. The doping region 224 is disposed in the fourth well 221 and disposed adjacent to the doping region 222 but not in contact with the doping region 222. The doping region 214 and the doping region 224 have a second conductivity type. In the embodiment shown in FIG. 2A, the doping regions 214 and 224 are N-type doping regions. In other embodiments, when the second well 211 and the fourth well 221 are N-type doping wells, the doping regions 214 and 224 may be P-type doping regions.

The gate structure 215 is disposed on the second well 211 and disposed between the doping region 212 and the doping region 214. The gate structure 215 and the doping region 214 are electrically connected to the doping region 213 through metal interconnection. The gate structure 225 is disposed on the fourth well 221 and disposed between the doping region 222 and the doping region 224. The gate structure 225 and the doping region 224 are electrically connected to the doping region 223 through metal interconnection.

Figure 2B:
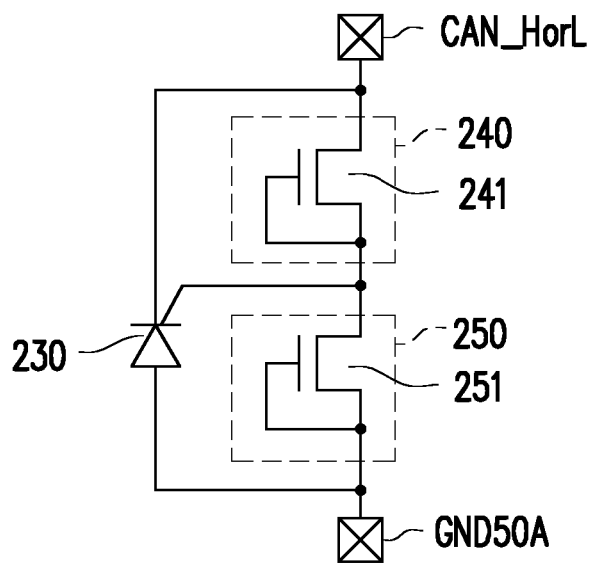
FIG. 2B is a schematic circuit block diagram of an ESD protection apparatus according to another embodiment of the present disclosure.

FIG. 2B is a schematic circuit block diagram of an ESD protection apparatus according to another embodiment of the present disclosure. The circuit shown in FIG. 2B can be regarded as an equivalent circuit of the layout structure shown in FIG. 2A, and the layout structure shown in FIG. 2A can be regarded as a layout example of the circuit shown in FIG. 2B. The ESD protection apparatus shown in FIG. 2B includes an SCR 230, an ESD protection circuit 240, and an ESD protection circuit 250. The SCR 230, the ESD protection circuit 240, and the ESD protection circuit 250 shown in FIG. 2B can be inferred from descriptions of the SCR 130, the ESD protection circuit 140 and the ESD protection circuit 150 shown in FIG. 1B.

In the embodiment shown in FIG. 2B, the ESD protection circuit 240 includes a transistor 241, and the ESD protection circuit 250 includes a transistor 251. The first terminal (e.g., the drain) of the transistor 241 serves as the first terminal of the ESD protection circuit 240 to be coupled to the pad CAN_HorL. The second terminal (e.g., the source) and the control terminal (e.g., the gate) of the transistor 241 serve as the second terminal of the ESD protection circuit 240. The first terminal (e.g., the drain) of the transistor 251 serves as the first terminal of the ESD protection circuit 250 to be coupled to the second terminal of the ESD protection circuit 240. The second terminal (such as the source) and the control terminal (such as the gate) of the transistor 251 serve as the second terminal of the ESD protection circuit 250 to be coupled to the pad GND50A.

Please refer to FIG. 2A and FIG. 2B. The layout structure formed by the doping region 212, the second well 211, the first well 210 and the substrate 200 is embedded with an SCR (corresponding to the SCR 230), wherein the doping region 212 corresponds to the cathode, the second well 211 corresponds to the gate, and the substrate 200 corresponds to the anode. The second well 211, the doping region 212, a doping region 214 and a gate structure 215 form a transistor (corresponding to the transistor 241), wherein the doping region 212 corresponds to the drain, the gate structure 215 corresponds to the gate, and the doping region 214 corresponds to the source. A fourth well 221, a doping region 222, a doping region 224, and a gate structure 225 form a transistor (corresponding to the transistor 251), wherein the doping region 222 corresponds to the drain, the gate structure 225 corresponds to the gate, and the doping region 224 corresponds to the source.

As compared with the SCR, the transistors 241 and 251 have a lower trigger voltage. Compared with a transistor, the SCR 230 can withstand greater on-current. When the ESD occurs to the pad CAN_HorL, the ESD current flows through the transistors 241 and 251, thereby instantly triggering the SCR 230. When the SCR 230 is turned on, the SCR 230 can transfer a large amount of ESD current between the pad CAN_HorL and the pad GND50A. In this way, the ESD protection apparatus shown in FIGS. 2A and 2B can provide ESD protection.

Figure 3A:
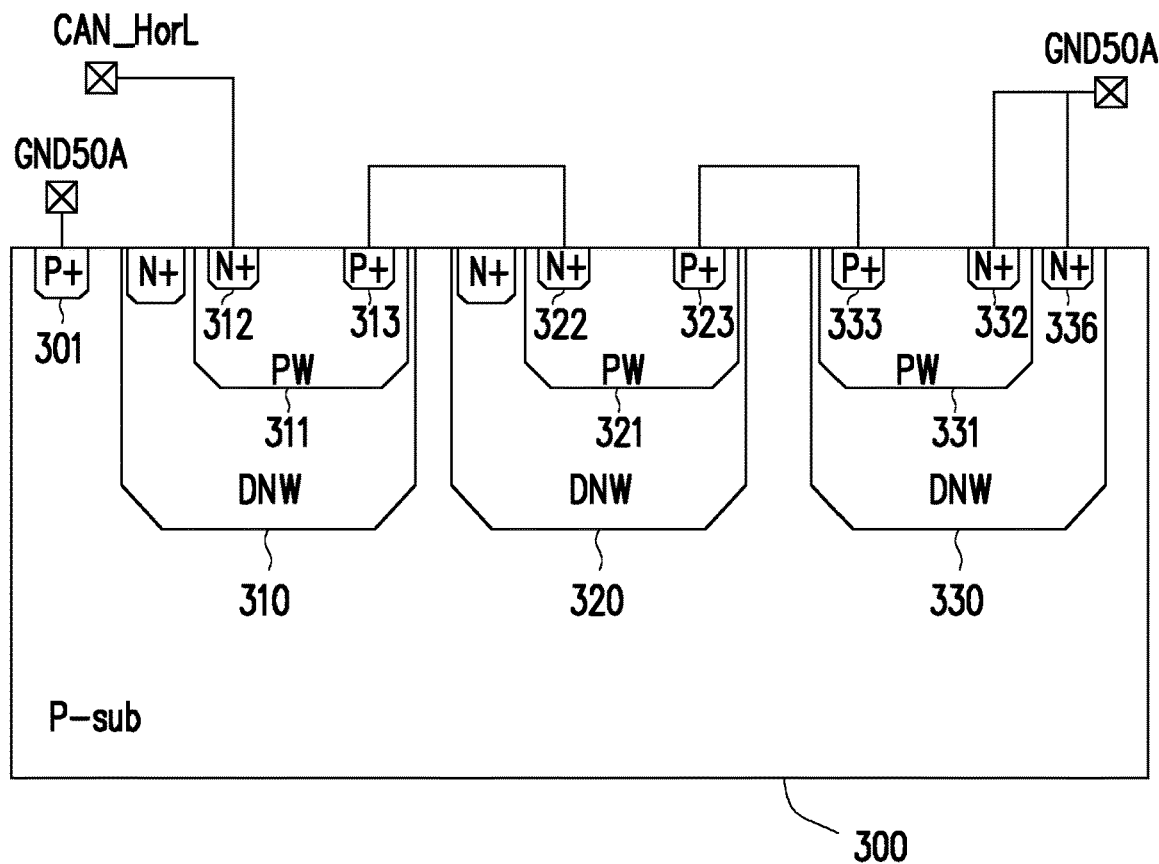
FIG. 3A is a schematic cross-sectional view showing a layout structure of an ESD protection apparatus according to still another embodiment of the present disclosure.

FIG. 3A is a schematic cross-sectional view showing a layout structure of an ESD protection apparatus according to still another embodiment of the present disclosure. The ESD protection apparatus shown in FIG. 3A includes a substrate 300, a doping region 301, a first well 310, a second well 311, a doping region 312, a doping region 313, a third well 320, a fourth well 321, a doping region 322 and a doping region 323. In FIG. 3A, the substrate 300, the doping region 301, the first well 310, the second well 311, the doping region 312, the doping region 313, the third well 320, the fourth well 321, the doping region 322, and the doping region 323 can be inferred from descriptions of the substrate 100, the doping region 101, the first well 110, the second well 111, the doping region 112, the doping region 113, the third well 120, the fourth well 121, the doping region 122 and the doping region 123 shown in FIG. 1A, so no further descriptions are incorporated herein.

In the embodiment shown in FIG. 2A, the ESD protection apparatus further includes a fifth well 330, a sixth well 331, a doping region 332, a doping region 333, and a doping region 336. The fifth well 330 is disposed in the substrate 300. The sixth well 331 is disposed in the fifth well 330. The doping region 332 and the doping region 333 are disposed in the sixth well 331. The doping region 333 is electrically connected to the doping region 323 through metal interconnection. The doping region 336 is disposed in the fifth well 330 and disposed outside the sixth well 331. The doping region 332 and the doping region 336 are electrically connected to the pad GND50A through metal interconnection.

The sixth well 331 and the doping region 333 have the first conductivity type, and the fifth well 330, the doping region 332, and the doping region 336 have the second conductivity type. In the embodiment shown in FIG. 3A, the fifth well 330 is a deep doping N-type well, and the sixth well 331 is a P-type well, the doping regions 332 and 336 are N-type doping regions, and the doping region 333 is a P-type doping region. In other embodiments, the first conductivity type may be N type, and the second conductivity type may be P type.

Figure 3B:
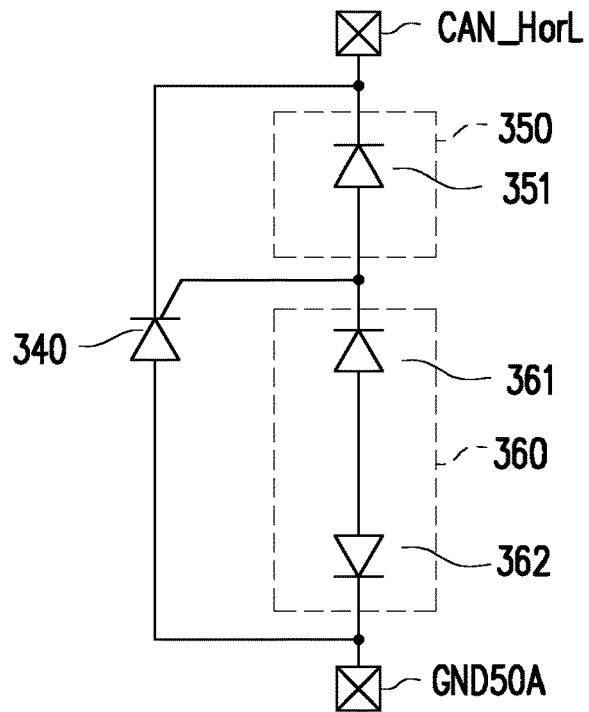
FIG. 3B is a schematic circuit block diagram of an ESD protection apparatus according to yet another embodiment of the present disclosure.

FIG. 3B is a schematic circuit block diagram of an ESD protection apparatus according to yet another embodiment of the present disclosure. The circuit shown in FIG. 3B can be regarded as an equivalent circuit of the layout structure shown in FIG. 3A, and the layout structure shown in FIG. 3A can be regarded as a layout example of the circuit shown in FIG. 3B. The ESD protection apparatus shown in FIG. 3B includes an SCR 340, an ESD protection circuit 350, and an ESD protection circuit 360. The SCR 340, the ESD protection circuit 350, and the ESD protection circuit 360 shown in FIG. 3B can be inferred from descriptions of the SCR 130, the ESD protection circuit 140, and the ESD protection circuit 150 shown in FIG. 1B.

In the embodiment shown in FIG. 3B, the ESD protection circuit 350 includes a diode 351. The diode 351 shown in FIG. 3B can be inferred with reference to the related description of the diode 141 shown in FIG. 1B. In the embodiment shown in FIG. 3B, the ESD protection circuit 360 includes a diode 361 and a diode 362. The cathode of the diode 361 serves as a first terminal of the ESD protection circuit 360 to be coupled to the second terminal of the ESD protection circuit 350. The anode of the diode 362 is coupled to the anode of the diode 361. The cathode of the diode 362 serves as the second terminal of the ESD protection circuit 360 to be coupled to the pad GND50A.

Please refer to FIG. 3A and FIG. 3B. The layout structure formed by the doping region 312, the second well 311, the first well 310 and the substrate 300 is embedded with an SCR (corresponding to the SCR 340), wherein the doping region 312 corresponds to the cathode, the second well 311 corresponds to the gate, and the substrate 300 corresponds to the anode. A diode (corresponding to the diode 351) is formed by the doping region 312 and the second well 311, wherein the doping region 312 corresponds to the cathode, and the second well 311 corresponds to the anode. A diode (corresponding to the diode 361) is formed by the doping region 322 and the fourth well 321, wherein the doping region 322 corresponds to the cathode, and the fourth well 321 corresponds to the anode. A diode (corresponding to the diode 362) is formed by the doping region 332 and the sixth well 331, wherein the doping region 332 corresponds to the cathode, and the sixth well 331 corresponds to the anode.

As compared with the SCR, the diodes 351, 361, and 362 have a lower trigger voltage. Compared with the diode, the SCR 340 can withstand greater on-current. When an ESD occurs to the pad CAN_HorL, the ESD current flows through the diodes 351, 361, and 362, thereby instantly triggering the SCR 340. When the SCR 340 is turned on, the SCR 340 can transfer a large amount of ESD current between the pad CAN_HorL and the pad GND50A. In this way, the ESD protection apparatus shown in FIGS. 3A and 3B can provide ESD protection.

Figure 4A:
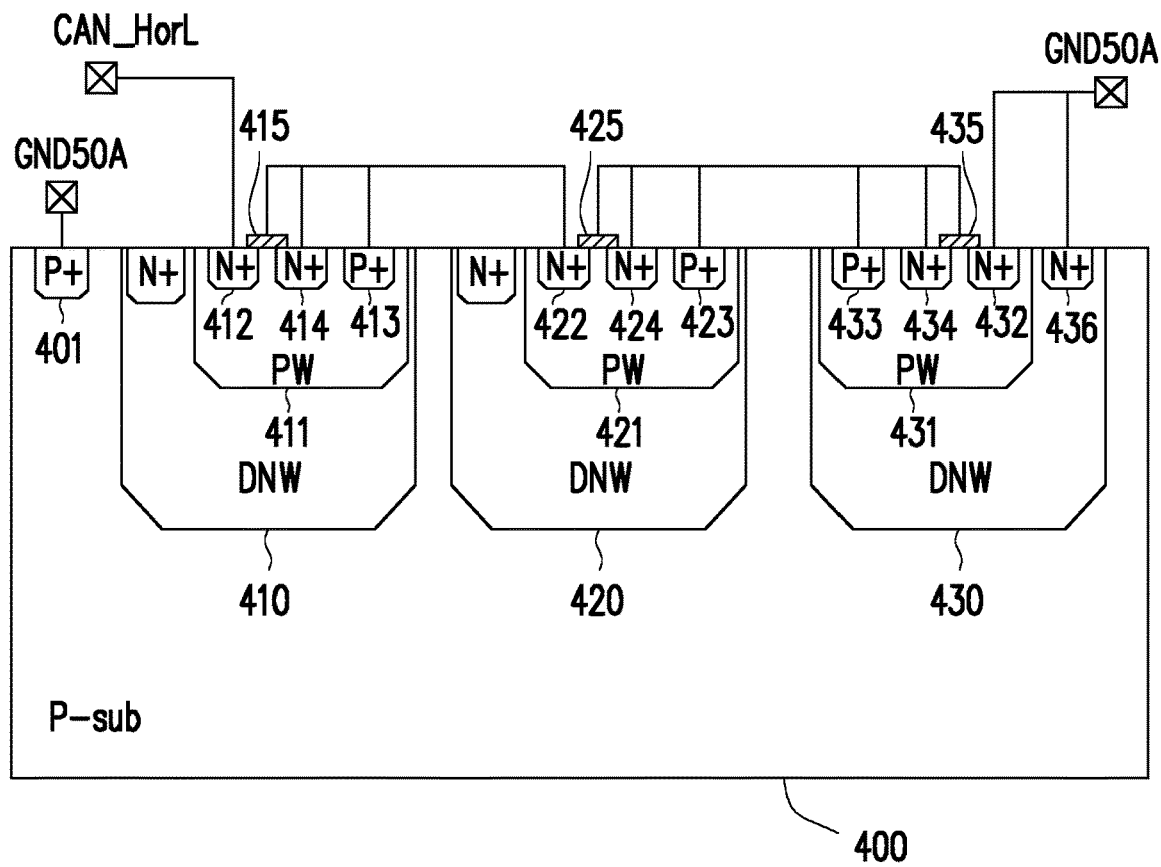
FIG. 4A is a schematic cross-sectional view showing a layout structure of an ESD protection apparatus according to still another embodiment of the present disclosure.

FIG. 4A is a schematic cross-sectional view showing a layout structure of an ESD protection apparatus according to still another embodiment of the present disclosure. The ESD protection apparatus shown in FIG. 4A includes a substrate 400, a doping region 401, a first well 410, a second well 411, a doping region 412, a doping region 413, a third well 420, a fourth well 421, a doping region 422, a doping region 423, a fifth well 430, a sixth well 431, a doping region 432, a doping region 433, and a doping region 436. In FIG. 4A, the substrate 400, the doping region 401, the first well 410, the second well 411, the doping region 412, the doping region 413, the third well 420, the fourth well 421, the doping region 422, the doping region 423, the fifth well 430, the sixth well 431, the doping region 432, the doping region 433, and the doping region 436 can be inferred from descriptions of the substrate 300, the doping region 301, the first well 310, the second well 311, the doping region 312, the doping region 313, the third well 320, the fourth well 321, the doping region 322, the doping region 323, the fifth well 330, the sixth well 331, the doping region 332, the doping region 333 and the doping region 336 shown in FIG. 3A, so no further descriptions are incorporated herein.

In the embodiment shown in FIG. 4A, the ESD protection apparatus further includes a doping region 414, a gate structure 415, a doping region 424, a gate structure 425, a doping region 434, and a gate structure 435. The doping region 412, the doping region 414, the gate structure 415, the doping region 422, the doping region 424, and the gate structure 425 shown in FIG. 4A can be inferred from descriptions of the doping region 212, the doping region 214, the gate structure 215, the doping region 222, the doping region 224, and the gate structure 225 shown in FIG. 2A, so no further descriptions are incorporated herein.

In the embodiment shown in FIG. 4A, the doping region 434 is disposed in the sixth well 431 and disposed adjacent to the doping region 432 but not in contact with the doping region 432. The doping region 434 is electrically connected to the doping region 433 through metal interconnection. The doping region 434 has a second conductivity type. In the embodiment shown in FIG. 4A, the doping regions 432 and 434 are N-type doping regions. In other embodiments, when the sixth well 431 is an N-type doping well, the doping regions 432 and 434 may be P-type doping regions. The gate structure 435 is disposed on the sixth well 431 and disposed between the doping region 432 and the doping region 434. The gate structure 435 is electrically connected to the doping region 434 through metal interconnection.

Figure 4B:
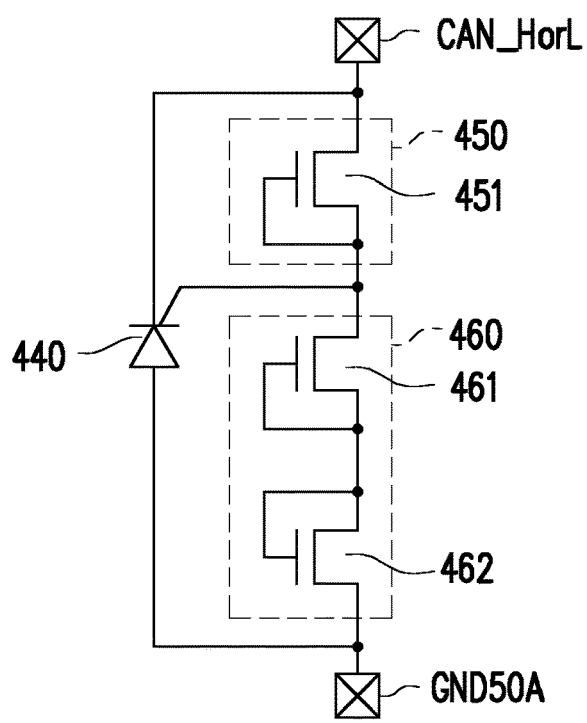
FIG. 4B is a schematic circuit block diagram of an ESD protection apparatus according to yet another embodiment of the present disclosure.

FIG. 4B is a schematic circuit block diagram of an ESD protection apparatus according to yet another embodiment of the present disclosure. The circuit shown in FIG. 4B can be regarded as an equivalent circuit of the layout structure shown in FIG. 4A, and the layout structure shown in FIG. 4A can be regarded as a layout example of the circuit shown in FIG. 4B. The ESD protection apparatus shown in FIG. 4B includes an SCR 440, an ESD protection circuit 450, and an ESD protection circuit 460. The SCR 440, the ESD protection circuit 450, and the ESD protection circuit 460 shown in FIG. 4B can be inferred from descriptions of the SCR 130, the ESD protection circuit 140 and the ESD protection circuit 150 shown in FIG. 1B.

In the embodiment shown in FIG. 4B, the ESD protection circuit 450 includes a transistor 451, and the ESD protection circuit 460 includes a transistor 461 and a transistor 462. The first terminal of the transistor 451 (e.g., the drain) serves as the first terminal of the ESD protection circuit 450 to be coupled to the pad CAN_HorL. The second terminal (e.g., the source) and the control terminal (e.g., the gate) of the transistor 451 serve as the second terminal of the ESD protection circuit 450. The first terminal (e.g., the drain) of the transistor 461 serves as the first terminal of the ESD protection circuit 460 to be coupled to the second terminal of the ESD protection circuit 450. The first terminal (e.g., the source) and the control terminal (e.g., the gate) of the transistor 462 are coupled to the second terminal (e.g., the source) and the control terminal (e.g., the gate) of the transistor 461. The second terminal (e.g., the drain) of the transistor 462 serves as the second terminal of the ESD protection circuit 460 to be coupled to the pad GND50A.

Please refer to FIG. 4A and FIG. 4B. The layout structure formed by the doping region 412, the second well 411, the first well 410 and the substrate 400 is embedded with an SCR (corresponding to an SCR 440), wherein the doping region 412 corresponds to the cathode, the second well 411 corresponds to the gate, and the substrate 400 corresponds to the anode. The second well 411, the doping region 412, a doping region 414, and a gate structure 415 form a transistor (corresponding to the transistor 451), wherein the doping region 412 corresponds to the drain, the gate structure 415 corresponds to the gate, and the doping region 414 corresponds to the source. A fourth well 421, a doping region 422, a doping region 424, and a gate structure 425 form a transistor (corresponding to a transistor 461), wherein the doping region 422 corresponds to the drain, the gate structure 425 corresponds to the gate, and the doping region 424 corresponds to the source. A sixth well 431, a doping region 432, a doping region 434, and a gate structure 435 form a transistor (corresponding to a transistor 462), wherein the doping region 432 corresponds to the drain, the gate structure 435 corresponds to the gate, and the doping region 434 corresponds to the source.

As compared with the SCR, the transistors 451, 461 and 462 have a lower trigger voltage. Compared with a transistor, an SCR 440 can withstand greater on-current. When the ESD occurs to the pad CAN_HorL, the ESD current flows through the transistors 451, 461 and 462, thereby instantly triggering the SCR 440. When the SCR 440 is turned on, the SCR 440 can transfer a large amount of ESD current between the pad CAN_HorL and the pad GND50A. Therefore, the ESD protection apparatus shown in FIGS. 4A and 4B can provide ESD protection.

Figure 5A:
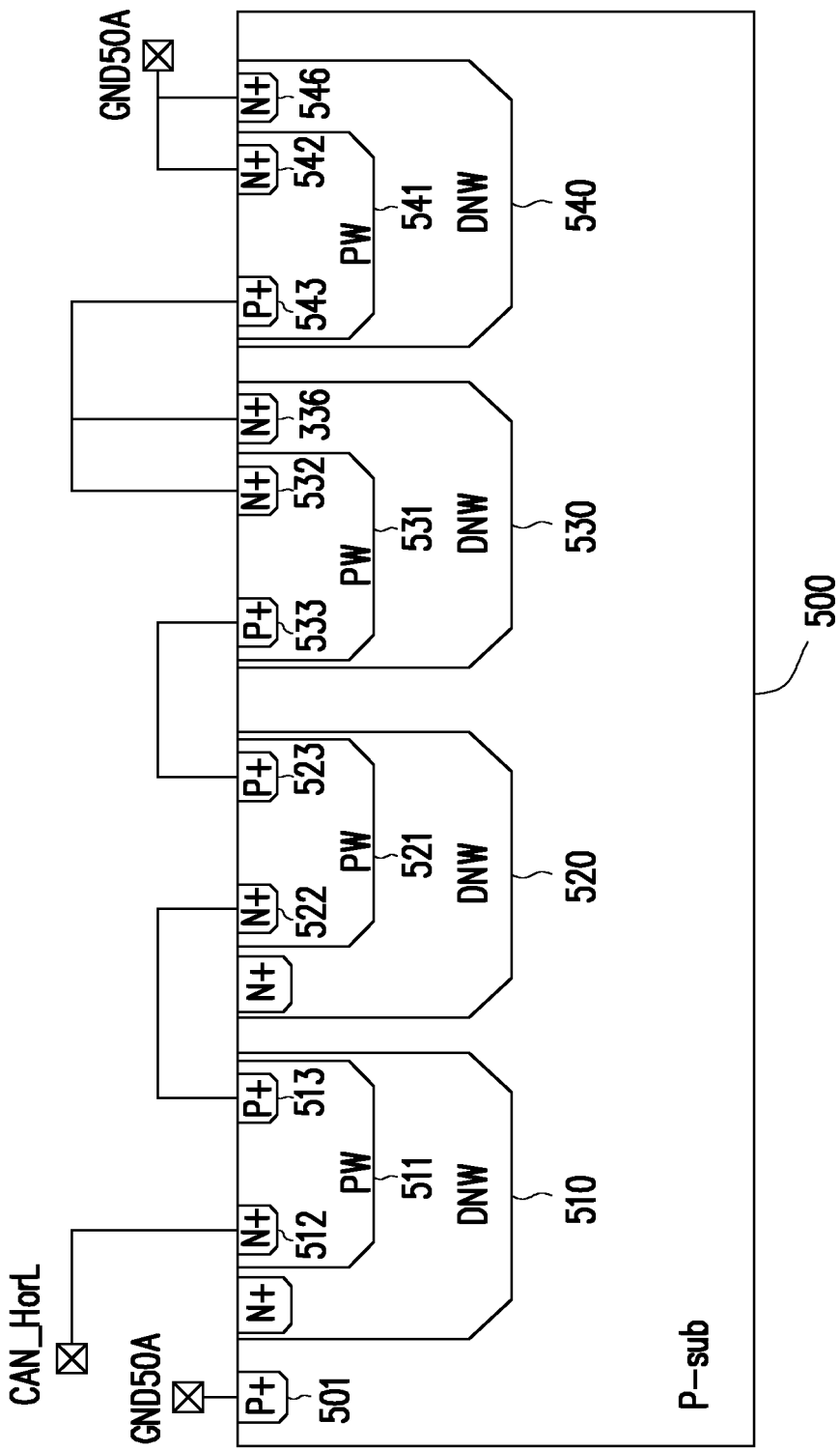
FIG. 5A is a schematic cross-sectional view showing a layout structure of an ESD protection apparatus according to another embodiment of the present disclosure.

FIG. 5A is a schematic cross-sectional view showing a layout structure of an ESD protection apparatus according to another embodiment of the present disclosure. The ESD protection apparatus shown in FIG. 5A includes a substrate 500, a doping region 501, a first well 510, a second well 511, a doping region 512, a doping region 513, a third well 520, a fourth well 521, a doping region 522, a doping region 523, a fifth well 530, a sixth well 531, a doping region 532, a doping region 533 and a doping region 536. The substrate 500, the doping region 501, the first well 510, the second well 511, the doping region 512, the doping region 513, the third well 520, the fourth well 521, the doping region 522, the doping region 523, the fifth well 530, the sixth well 531, the doping region 532, the doping region 533, and the doping region 536 shown in FIG. 5A can be inferred from descriptions of the substrate 300, the doping region 301, the first well 310, the second well 311, the doping region 312, the doping region 313, the third well 320, the fourth well 321, the doping region 322, the doping region 323, the fifth well 330, the sixth well 331, the doping region 332, the doping region 333 and the doping region 336 shown in FIG. 3A, so no further descriptions are incorporated herein.

In the embodiment shown in FIG. 5A, the ESD protection apparatus further includes a seventh well 540, an eighth well 541, a doping region 542, a doping region 543, and a doping region 546. The seventh well 540 is disposed in the substrate 500. The eighth well 541 is disposed in the seventh well 540. The doping region 542 and the doping region 543 are disposed in the eighth well 541. The doping region 543 is electrically connected to the doping regions 532 and 536 through metal interconnection. The doping region 546 is disposed in the seventh well 540 and is disposed outside the eighth well 541. The doping region 542 and the doping region 546 are electrically connected to the pad GND50A through metal interconnection.

The eighth well 541 and the doping region 543 have the first conductivity type, and the seventh well 540, the doping region 542 and the doping region 546 have the second conductivity type. In the embodiment shown in FIG. 5A, the seventh well 540 is a deep doping N-type well, and the eighth well 541 is a P-type well, and the doping regions 542 and 546 are N-type doping regions, and doping region 543 is a P-type doping region. In other embodiments, the first conductivity type may be N type, and the second conductivity type may be P type.

Figure 5B:
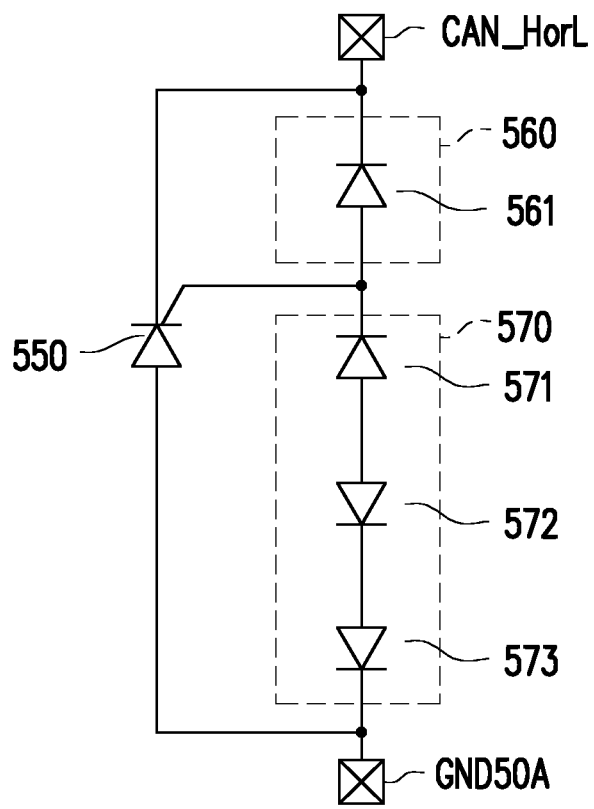
FIG. 5B is a schematic circuit block diagram of an ESD protection apparatus according to yet another embodiment of the present disclosure.

FIG. 5B is a schematic circuit block diagram of an ESD protection apparatus according to yet another embodiment of the present disclosure. The circuit shown in FIG. 5B can be regarded as an equivalent circuit of the layout structure shown in FIG. 5A, and the layout structure shown in FIG. 5A can be regarded as a layout example of the circuit shown in FIG. 5B. The ESD protection apparatus shown in FIG. 5B includes an SCR 550, an ESD protection circuit 560, and an ESD protection circuit 570. The SCR 550, the ESD protection circuit 560, and the ESD protection circuit 570 shown in FIG. 5B can be referred from descriptions of the SCR 130, the ESD protection circuit 140, and the ESD protection circuit 150.

In the embodiment shown in FIG. 5B, the ESD protection circuit 560 includes a diode 561. The diode 561 shown in FIG. 5B can be inferred with reference to the description of the diode 141 shown in FIG. 1B. In the embodiment shown in FIG. 5B, the ESD protection circuit 570 includes a diode 571, a diode 572, and a diode 573. The cathode of the diode 571 serves as the first terminal of the ESD protection circuit 570 to be coupled to the second terminal of the ESD protection circuit 560. The anode of the diode 572 is coupled to the anode of the diode 571. The anode of the diode 573 is coupled to the cathode of the diode 572. The cathode of the diode 573 serves as the second terminal of the ESD protection circuit 570 to be coupled to the pad GND50A.

Please refer to FIG. 5A and FIG. 5B. The layout structure formed by the doping region 512, the second well 511, the first well 510 and the substrate 500 is embedded with an SCR (corresponding to an SCR 550), wherein the doping region 512 corresponds to the cathode, the second well 511 corresponds to the gate, and the substrate 500 corresponds to the anode. A diode (corresponding to the diode 561) is formed by the doping region 512 and the second well 511, wherein the doping region 512 corresponds to the cathode, and the second well 511 corresponds to the anode. A diode (corresponding to the diode 571) is formed by the doping region 522 and the fourth well 521, wherein the doping region 522 corresponds to the cathode, and the fourth well 521 corresponds to the anode. A diode (corresponding to the diode 572) is formed by the doping region 532 and the sixth well 531, wherein the doping region 532 corresponds to the cathode, and the sixth well 531 corresponds to the anode. A diode (corresponding to the diode 573) is formed by the doping region 542 and the eighth well 541, wherein the doping region 542 corresponds to the cathode, and the eighth well 541 corresponds to the anode.

As compared with the SCR, the diodes 561, 571, 572 and 573 have a lower trigger voltage. Compared with the diode, the SCR 550 can withstand greater on-current. When an ESD occurs to the pad CAN_HorL, the ESD current flows through the diodes 561, 571, 572, and 573, thereby instantly triggering the SCR 550. When the SCR 550 is turned on, the SCR 550 can transfer a large amount of ESD current between the pad CAN_HorL and the pad GND50A. In this way, the ESD protection apparatus shown in FIGS. 5A and 5B can provide ESD protection.

Figure 6A:
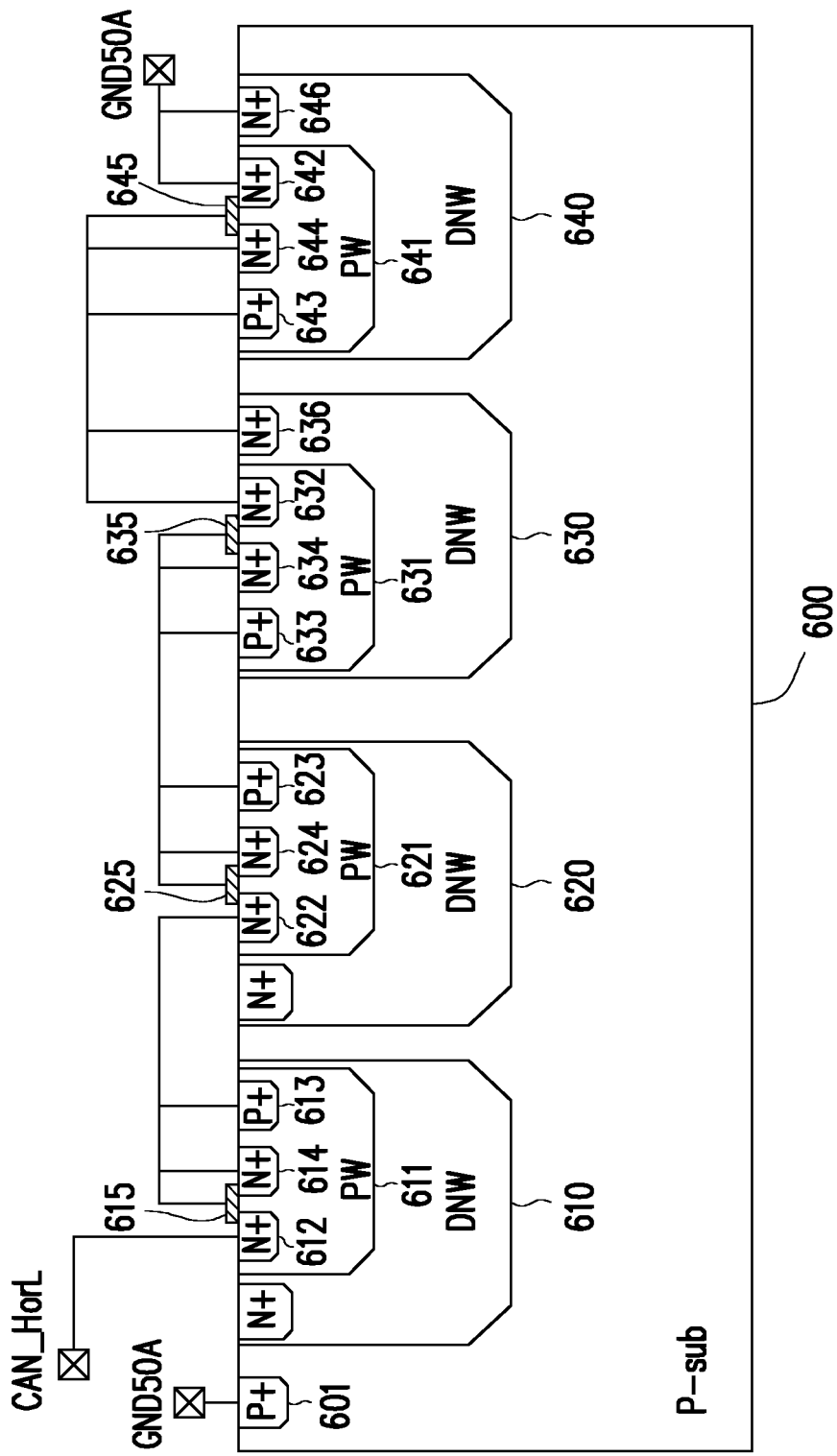
FIG. 6A is a schematic cross-sectional view showing a layout structure of an ESD protection apparatus according to still another embodiment of the present disclosure.

FIG. 6A is a schematic cross-sectional view showing a layout structure of an ESD protection apparatus according to still another embodiment of the present disclosure. The ESD protection apparatus shown in FIG. 6A includes a substrate 600, a doping region 601, a first well 610, a second well 611, a doping region 612, a doping region 613, a third well 620, a fourth well 621, a doping region 622, a doping region 623, a fifth well 630, a sixth well 631, a doping region 632, a doping region 633, a doping region 636, a seventh well 640, an eighth well 641, a doping region 642, a doping region 643 and a doping region 646. The substrate 600, the doping region 601, the first well 610, the second well 611, the doping region 612, the doping region 613, the third well 620, the fourth well 621, the doping region 622, the doping region 623, the fifth well 630, the sixth well 631, the doping region 632, the doping region 633, the doping region 636, the seventh well 640, the eighth well 641, the doping region 642, the doping region 643 and the doping region 646 shown in FIG. 6A can be inferred from descriptions of the substrate 500, the doping region 501, the first well 510, the second well 511, the doping region 512, the doping region 513, the third well 520, the fourth well 521, the doping region 522, the doping region 523, the fifth well 530, the sixth well 531, the doping region 532, the doping region 533, the doping region 536, the seventh well 540, the eighth well 541, the doping region 542, the doping region 543 and the doping region 546 shown in FIG. 5A, so no further descriptions are incorporated herein.

In the embodiment shown in FIG. 6A, the ESD protection apparatus further includes a doping region 614, a gate structure 615, a doping region 624, a gate structure 625, a doping region 634, a gate structure 635, a doping region 644 and a gate structure 645. The doping region 614, the gate structure 615, the doping region 624, the gate structure 625, the doping region 634 and the gate structure 635 shown in FIG. 6A can be inferred from descriptions of the doping region 414, the gate structure 415, the doping region 424, the gate structure 425, the doping region 434, and the gate structure 435 shown in FIG. 4A, so no further descriptions are incorporated herein.

In the embodiment shown in FIG. 6A, the doping region 644 is disposed in the eighth well 641 and disposed adjacent to the doping region 642 but not in contact with the doping region 642. The doping region 644 is electrically connected to the doping region 643 through metal interconnection. The doping region 644 has the second conductivity type. In the embodiment shown in FIG. 6A, the doping regions 642 and 644 are N-type doping regions. In other embodiments, when the eighth well 641 is an N-type doping well, the doping regions 642 and 644 may be P-type doping regions. The gate structure 645 is disposed on the eighth well 641 and disposed between the doping region 642 and the doping region 644. The gate structure 645 is electrically connected to the doping region 644 through metal interconnection.

Figure 6B:
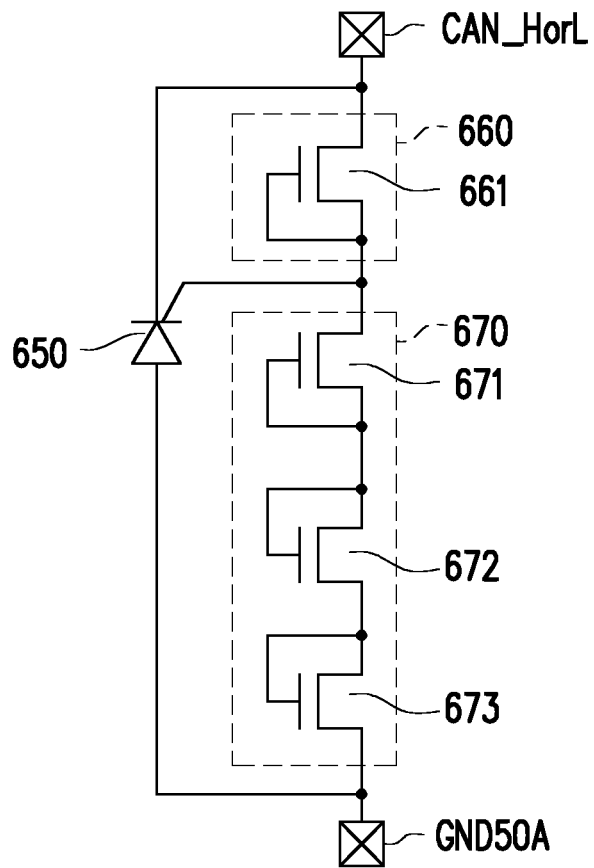
FIG. 6B is a schematic circuit block diagram of an ESD protection apparatus according to still another embodiment of the present disclosure.

FIG. 6B is a schematic circuit block diagram of an ESD protection apparatus according to still another embodiment of the present disclosure. The circuit shown in FIG. 6B can be regarded as an equivalent circuit of the layout structure shown in FIG. 6A, and the layout structure shown in FIG. 6A can be regarded as a layout example of the circuit shown in FIG. 6B. The ESD protection apparatus shown in FIG. 6B includes an SCR 650, an ESD protection circuit 660, and an ESD protection circuit 670. The SCR 650, the ESD protection circuit 660, and the ESD protection circuit 670 shown in FIG. 6B can be inferred from descriptions of the SCR 130, the ESD protection circuit 140, and the ESD protection circuit 150 shown in FIG. 1B.

In the embodiment shown in FIG. 6B, the ESD protection circuit 660 includes a transistor 661, and the ESD protection circuit 670 includes a transistor 671, a transistor 672, and a transistor 673. The first terminal (e.g., the drain) of the transistor 661 serves as the first terminal of the ESD protection circuit 660 to be coupled to the pad CAN_HorL. The second terminal (e.g., the source) and the control terminal (e.g., the gate) of the transistor 661 serve as the second terminal of the ESD protection circuit 660. The first terminal (e.g., the drain) of the transistor 671 serves as the first terminal of the ESD protection circuit 670 to be coupled to the second terminal of the ESD protection circuit 660. The first terminal (e.g., the source) and the control terminal (e.g., the gate) of the transistor 672 are coupled to the second terminal (e.g., the source) and the control terminal (e.g., the gate) of the transistor 671. The first terminal (e.g., the source) and the control terminal (e.g., the gate) of the transistor 673 are coupled to the second terminal (e.g., the drain) of the transistor 672. The second terminal (e.g., the drain) of the transistor 673 serves as the second terminal of the ESD protection circuit 670 to be coupled to the pad GND50A.

Please refer to FIG. 6A and FIG. 6B. The layout structure formed by the doping region 612, the second well 611, the first well 610 and the substrate 600 is embedded with an SCR (corresponding to an SCR 650), wherein the doping region 612 corresponds to the cathode, the second well 611 corresponds to the gate, and the substrate 600 corresponds to the anode. A second well 611, a doping region 612, a doping region 614, and a gate structure 615 form a transistor (corresponding to a transistor 661), wherein the doping region 612 corresponds to the drain, the gate structure 615 corresponds to the gate, and the doping region 614 corresponds to the source. A fourth well 621, a doping region 622, a doping region 624, and a gate structure 625 form a transistor (corresponding to a transistor 671), wherein the doping region 622 corresponds to the drain, the gate structure 625 corresponds to the gate, and the doping region 624 corresponds to the source. A sixth well 631, a doping region 632, a doping region 634 and a gate structure 635 form a transistor (corresponding to a transistor 672), wherein the doping region 632 corresponds to the drain, the gate structure 635 corresponds to the gate, and the doping region 634 corresponds to the source. The eighth well 641, the doping region 642, the doping region 644 and the gate structure 645 form a transistor (corresponding to the transistor 673), wherein the doping region 642 corresponds to the drain, the gate structure 645 corresponds to the gate, and the doping region 644 corresponds to the source.

As compared with the SCR, the transistors 661, 671, 672, and 673 have a lower trigger voltage. Compared with a transistor, an SCR 650 can withstand greater on-current. When an ESD occurs to the pad CAN_HorL, the ESD current flows through the transistors 661, 671, 672, and 673, thereby instantly triggering the SCR 650. When the SCR 650 is turned on, the SCR 650 can transfer a large amount of ESD current between the pad CAN_HorL and the pad GND50A. Therefore, the ESD protection apparatus shown in FIGS. 6A and 6B can provide ESD protection.

Figure 7:
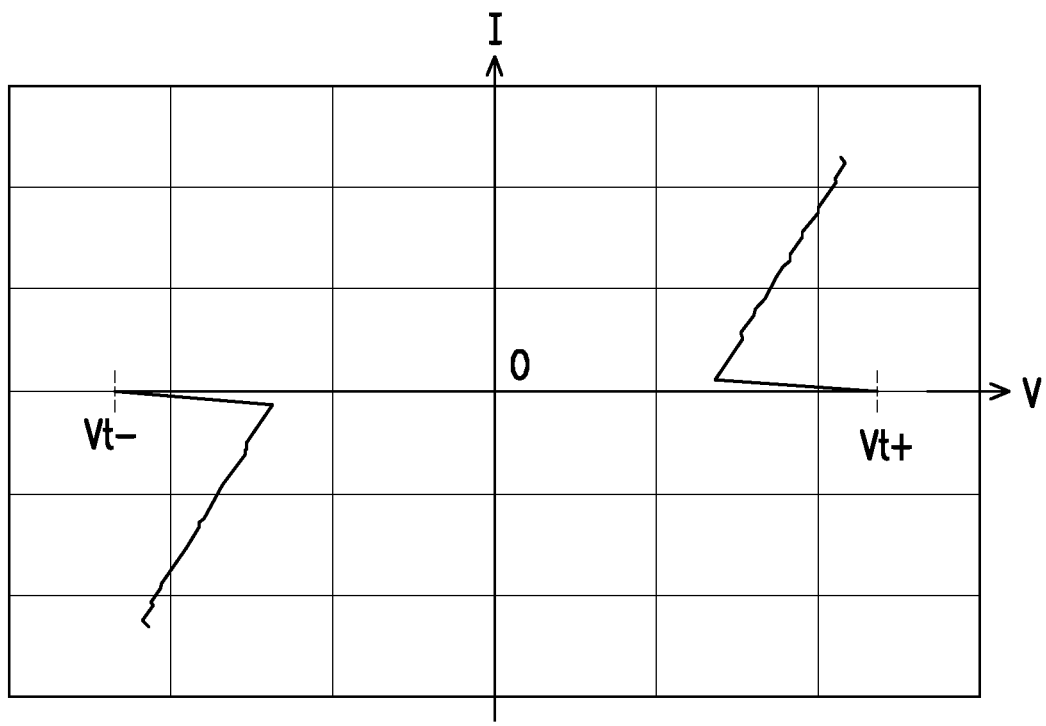
FIG. 7 is a schematic diagram of the characteristic curve of the ESD protection apparatus shown in FIGS. 6A and 6B.

FIG. 7 is a schematic diagram of the characteristic curve of the ESD protection apparatus shown in FIGS. 6A and 6B. The horizontal axis shown in FIG. 7 represents the voltage V, and the vertical axis represents the current I. When the positive pulse voltage (positive voltage of the ESD) occurring to the pad CAN_HorL is greater than the trigger voltage Vt+, the SCR 650 and the transistors 661, 671, 672, and 673 can be instantly turned on to transfer the ESD current from the pad CAN_HorL to the pad GND50A. By changing the number of transistors 661 and 671, the trigger voltage Vt+ can be adjusted correspondingly to meet the design requirements.

When the negative pulse voltage (negative voltage of ESD) occurring to the pad CAN_HorL is less than the trigger voltage Vt−, the SCR 650 and the transistors 661, 671, 672, and 673 can be instantly turned on to transfer the ESD current from the pad GND50A to the pad CAN_HorL. By changing the number of transistors 672 and 673, the trigger voltage Vt− can be adjusted correspondingly to meet the design requirements.

Figure 8A:
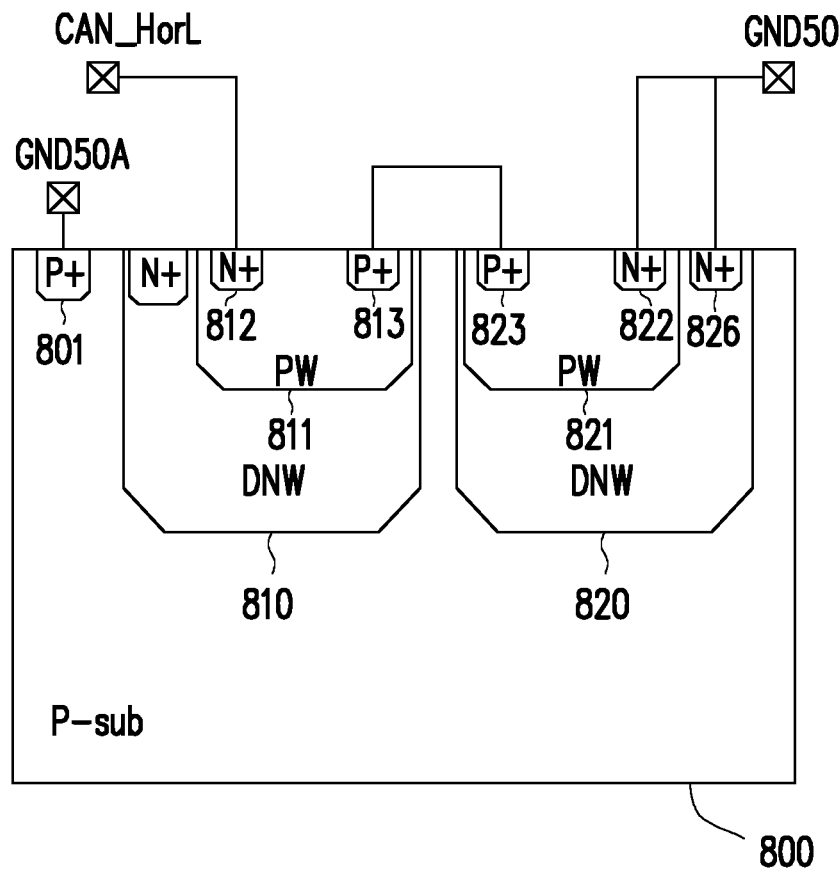
FIG. 8A is a schematic cross-sectional view showing a layout structure of an ESD protection apparatus according to still another embodiment of the present disclosure.

FIG. 8A is a schematic cross-sectional view showing a layout structure of an ESD protection apparatus according to still another embodiment of the present disclosure. The ESD protection apparatus shown in FIG. 8A includes a substrate 800, a doping region 801, a first well 810, a second well 811, a doping region 812, a doping region 813, a third well 820, a fourth well 821, a doping region 822, a doping region 823 and a doping region 826. The substrate 800, the doping region 801, the first well 810, the second well 811, the doping region 812, the doping region 813, the third well 820, the fourth well 821, the doping region 822, the doping region 823 and the doping region 826 shown in FIG. 8A can be inferred from descriptions of the substrate 500, the doping region 501, the first well 510, the second well 511, the doping region 512, the doping region 513, the seventh well 540, the eighth well 541, the doping region 542, the doping region 543 and the doping region 546 shown in FIG. 5A, so no further descriptions are incorporated herein. In the embodiment shown in FIG. 8A, the doping region 823 is electrically connected to the doping region 813 through metal interconnection.

Figure 8B:
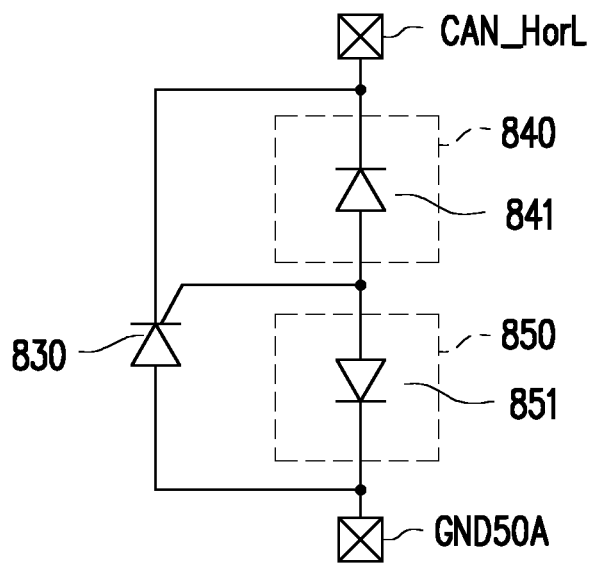
FIG. 8B is a schematic circuit block diagram of an ESD protection apparatus according to yet another embodiment of the present disclosure.

FIG. 8B is a schematic circuit block diagram of an ESD protection apparatus according to yet another embodiment of the present disclosure. The circuit shown in FIG. 8B can be regarded as an equivalent circuit of the layout structure shown in FIG. 8A, and the layout structure shown in FIG. 8A can be regarded as a layout example of the circuit shown in FIG. 8B. The ESD protection apparatus shown in FIG. 8B includes an SCR 830, an ESD protection circuit 840, and an ESD protection circuit 850. The SCR 830, the ESD protection circuit 840, and the ESD protection circuit 850 shown in FIG. 8B can be inferred from descriptions of the SCR 130, the ESD protection circuit 140 and the ESD protection circuit 150 shown in FIG. 1B.

In the embodiment shown in FIG. 8B, the ESD protection circuit 840 includes a diode 841. The diode 841 shown in FIG. 8B can be inferred with reference to the related description of the diode 141 shown in FIG. 1B. In the embodiment shown in FIG. 8B, the ESD protection circuit 850 includes a diode 851. The anode of the diode 851 serves as the first terminal of the ESD protection circuit 850 to be coupled to the second terminal of the ESD protection circuit 840. The cathode of the diode 851 serves as the second terminal of the ESD protection circuit 850 to be coupled to the pad GND50A.

Please refer to FIG. 8A and FIG. 8B. A layout structure formed by the doping region 812, the second well 811, the first well 810 and the substrate 800 is embedded with an SCR (corresponding to an SCR 830), wherein the doping region 812 corresponds to the cathode, the second well 811 corresponds to the gate, and the substrate 800 corresponds to the anode. A diode (corresponding to the diode 841) is formed by the doping region 812 and the second well 811, wherein the doping region 812 corresponds to the cathode, and the second well 811 corresponds to the anode. A diode (corresponding to the diode 851) is formed by the doping region 822 and the fourth well 821, wherein the doping region 822 corresponds to the cathode, and the fourth well 821 corresponds to the anode.

As compared with the SCR, the diodes 841 and 851 have a lower trigger voltage. Compared with the diode, the SCR 830 can withstand greater on-current. When the ESD occurs to the pad CAN_HorL, the ESD current flows through the diodes 841 and 851, thereby instantly triggering the SCR 830. When the SCR 830 is turned on, the SCR 830 can transfer a large amount of ESD current between the pad CAN_HorL and the pad GND50A. In this way, the ESD protection apparatus shown in FIGS. 8A and 8B can provide ESD protection.

Figure 9A:
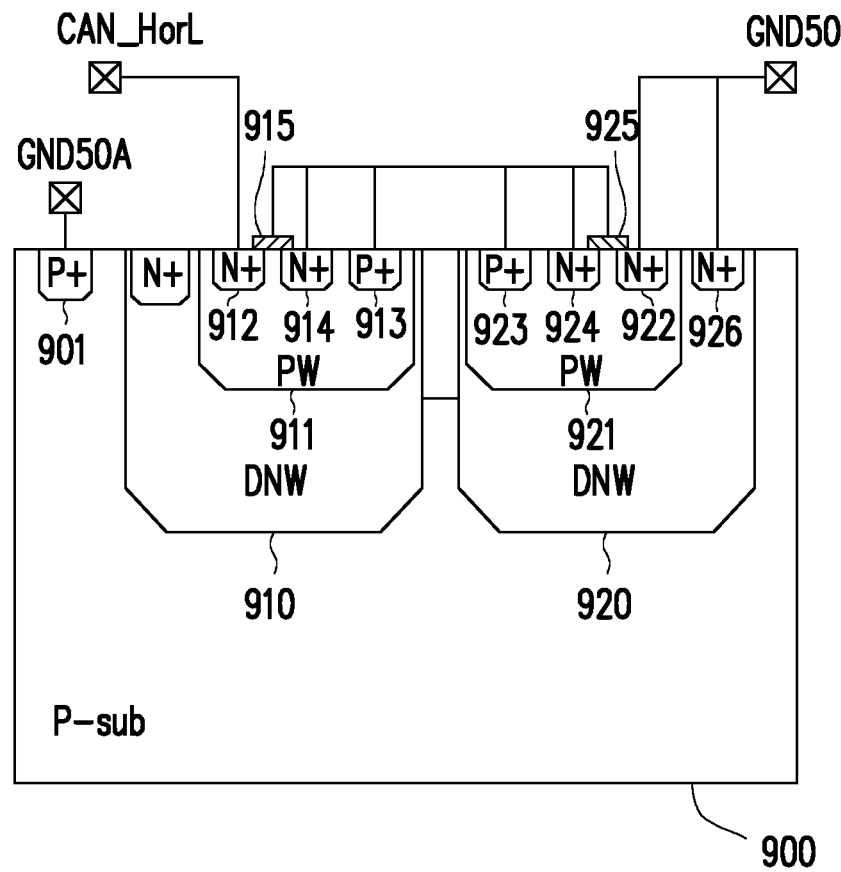
FIG. 9A is a schematic cross-sectional view showing a layout structure of an ESD protection apparatus according to still another embodiment of the present disclosure.

FIG. 9A is a schematic cross-sectional view showing a layout structure of an ESD protection apparatus according to still another embodiment of the present disclosure. The ESD protection apparatus shown in FIG. 9A includes a substrate 900, a doping region 901, a first well 910, a second well 911, a doping region 912, a doping region 913, a doping region 914, a gate structure 915, a third well 920, a fourth well 921, a doping region 922, a doping region 923, a doping region 924, a gate structure 925, and a doping region 926. The substrate 900, the doping region 901, the first well 910, the second well 911, the doping region 912, the doping region 913, the doping region 914, the gate structure 915, the third well 920, the fourth well 921, the doping region 922, the doping region 923, the doping region 924, the gate structure 925, and the doping region 926 shown in FIG. 9A can be inferred from descriptions of the substrate 600, the doping region 601, the first well 610, the second well 611, the doping region 612, the doping region 613, the doping region 614, the gate structure 615, the seventh well 640, the eighth well 641, the doping region 642, the doping region 643, the doping region 644, the gate structure 645 and the doping region 646 shown in FIG. 6A, so no further descriptions are incorporated herein. In the embodiment shown in FIG. 9A, the doping region 923, the doping region 924, and the gate structure 925 are electrically connected to the doping region 913, the doping region 914, and the gate structure 915 through metal interconnection.

Figure 9B:
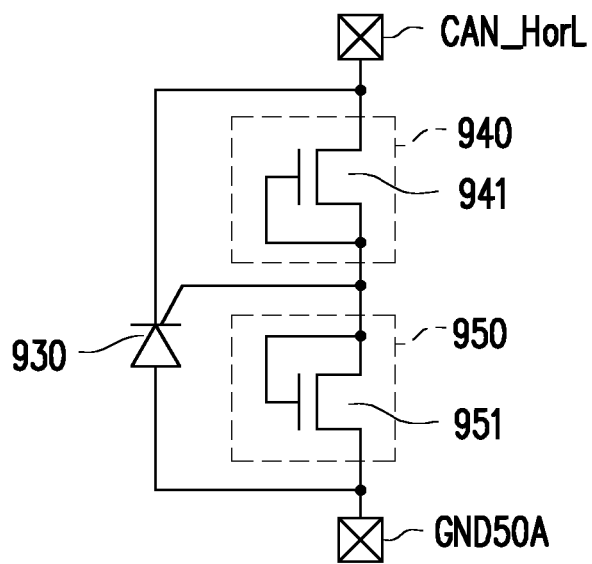
FIG. 9B is a schematic circuit block diagram of an ESD protection apparatus according to still another embodiment of the present disclosure.

FIG. 9B is a schematic circuit block diagram of an ESD protection apparatus according to still another embodiment of the present disclosure. The circuit shown in FIG. 9B can be regarded as an equivalent circuit of the layout structure shown in FIG. 9A, and the layout structure shown in FIG. 9A can be regarded as a layout example of the circuit shown in FIG. 9B. The ESD protection apparatus shown in FIG. 9B includes an SCR 930, an ESD protection circuit 940, and an ESD protection circuit 950. The SCR 930, the ESD protection circuit 940, and the ESD protection circuit 950 shown in FIG. 9B can be inferred from descriptions of the SCR 130, the ESD protection circuit 140, and the ESD protection circuit 150 shown in FIG. 1B.

In the embodiment shown in FIG. 9B, the ESD protection circuit 940 includes a transistor 941, and the ESD protection circuit 950 includes a transistor 951. The first terminal (e.g., the drain) of the transistor 941 serves as the first terminal of the ESD protection circuit 940 to be coupled to the pad CAN_HorL. The second terminal (e.g., the source) and the control terminal (e.g., the gate) of the transistor 941 serve as the second terminal of the ESD protection circuit 940. The first terminal (e.g., the source) and the control terminal (e.g., the gate) of the transistor 951 serve as the first terminal of the ESD protection circuit 950 to be coupled to the second terminal of the ESD protection circuit 940. The second terminal (for example, the drain) of the transistor 951 serves as the second terminal of the ESD protection circuit 950 to be coupled to the pad GND50A.

Please refer to FIG. 9A and FIG. 9B. The layout structure formed by the doping region 912, the second well 911, the first well 910 and the substrate 900 is embedded with an SCR (corresponding to an SCR 930), wherein the doping region 912 corresponds to the cathode, the second well 911 corresponds to the gate, and the substrate 900 corresponds to the anode. A second transistor 911, a doping region 912, a doping region 914, and a gate structure 915 form a transistor (corresponding to a transistor 941), wherein the doping region 912 corresponds to the drain, the gate structure 915 corresponds to the gate, and the doping region 914 corresponds to the source. A fourth well 921, a doping region 922, a doping region 924, and a gate structure 925 form a transistor (corresponding to a transistor 951), wherein the doping region 922 corresponds to the drain, the gate structure 925 corresponds to the gate, and the doping region 924 corresponds to the source.

As compared with the SCR, the transistors 941 and 951 have a lower trigger voltage. Compared with a transistor, an SCR 930 can withstand greater on-current. When an ESD occurs to the pad CAN_HorL, the ESD current flows through the transistors 941 and 951, thereby instantly triggering the SCR 930. When the SCR 930 is turned on, the SCR 930 can transfer a large amount of ESD current between the pad CAN_HorL and the pad GND50A. In this way, the ESD protection apparatus shown in FIGS. 9A and 9B can provide ESD protection.

In summary, the ESD protection apparatus of the embodiments of the present disclosure provides a layout structure (ESD protection circuit). The layout structure is embedded with an SCR. When the ESD current flows through the first ESD protection circuit (the NP junction in the second well), the SCR is turned on instantly. In that circumstance, the SCR can transfer a large amount of ESD current between the pad CAN_HorL and the pad GND50A. In this way, the ESD protection apparatus can provide ESD protection.

Although the present disclosure has been disclosed in the above embodiments, it is not intended to limit the present disclosure, and those skilled in the art can make some modifications and refinements without departing from the spirit and scope of the disclosure. Therefore, the scope to be protected by the present disclosure is subject to the scope defined by the appended claims.

What is claimed is:

1. An electrostatic discharge (ESD) protection apparatus, further comprising:
   a first well disposed in a substrate having a first conductivity type, wherein the first well has a second conductivity type, and the substrate is electrically connected to a first pad;
   a second well disposed in the first well, wherein the second well has the first conductivity type;
   a first doping region disposed in the second well, wherein the first doping region has the second conductivity type, and the first doping region is electrically connected to a second pad;
   a second doping region disposed in the second well, wherein the second doping region has the first conductivity type;
   a third well disposed in the substrate, wherein the third well has the second conductivity type;
   a fourth well disposed in the third well, wherein the fourth well has the first conductivity type;
   a third doping region disposed in the fourth well, wherein the third doping region has the second conductivity type, and the third doping region is electrically connected to the second doping region;
   a fourth doping region disposed in the fourth well, wherein the fourth doping region has the first conductivity type;
   a fifth well disposed in the substrate, wherein the fifth well has the second conductivity type;
   a sixth well disposed in the fifth well, wherein the sixth well has the first conductivity type;
   a fifth doping region disposed in the sixth well, wherein the fifth doping region has the second conductivity type; and
   a sixth doping region disposed in the sixth well, wherein the sixth doping region has the first conductivity type, and the sixth doping region is electrically connected to the fourth doping region.

2. The ESD protection apparatus of claim 1, wherein the fifth well is a deep doping N-type well, the sixth well is a P-type doping well, the fifth doping region is an N-type doping region, and the sixth doping region is a P-type doping region.

3. The ESD protection apparatus of claim 1, further comprising:
   a seventh doping region disposed in the sixth well and disposed adjacent to the fifth doping region but not in contact with the fifth doping region, wherein the seventh doping region has the second conductivity type, and the seventh doping region is electrically connected to the sixth doping region; and
   a gate structure disposed on the sixth well and disposed between the fifth doping region and the seventh doping region, wherein the gate structure is electrically connected to the seventh doping region.

4. The ESD protection apparatus of claim 1, further comprising:
   a seventh doping region disposed in the fifth well and disposed outside the sixth well, wherein the seventh doping region has the second conductivity type, and the seventh doping region is electrically connected to the fifth doping region.

5. The ESD protection apparatus of claim 4, wherein the fifth doping region and the seventh doping region are electrically connected to the first pad.

6. The ESD protection apparatus of claim 1, further comprising:
   a seventh well disposed in the substrate, wherein the seventh well has the second conductivity type;
   an eighth well disposed in the seventh well, wherein the eighth well has the first conductivity type;
   a seventh doping region disposed in the eighth well, wherein the seventh doping region has the second conductivity type; and
   an eighth doping region disposed in the eighth well, wherein the eighth doping region has the first conductivity type, and the eighth doping region is electrically connected to the fifth doping region.

7. The ESD protection apparatus of claim 6, wherein the seventh well is a deep doping N-type well, the eighth well is a P-type doping well, the seventh doping region is an N-type doping region, and the eighth doping region is a P-type doping region.

8. The ESD protection apparatus of claim 6, further comprising:
a ninth doping region disposed in the eighth well and disposed adjacent to the seventh doping region but not in contact with the seventh doping region, wherein the ninth doping region has the second conductivity type, and the ninth doping region is electrically connected to the eighth doping region; and
a gate structure disposed on the eighth well and disposed between the seventh doping region and the ninth doping region, wherein the gate structure is electrically connected to the ninth doping region.

9. The ESD protection apparatus of claim 6, further comprising:
a ninth doping region disposed in the seventh well, and is disposed outside the eighth well, wherein the ninth doping region has the second conductivity type, and the ninth doping region is electrically connected to the seventh doping region.

10. The ESD protection apparatus of claim 9, wherein the seventh doping region and the ninth doping region are electrically connected to the first pad.

11. The ESD protection apparatus of claim 1, wherein the first pad is a power voltage pad or a reference voltage pad, and the second pad is a signal pad.

12. An ESD protection apparatus, comprising:
a silicon-controlled rectifier (SCR) having a first terminal coupled to a first pad, wherein a second terminal of the SCR is coupled to a second pad;
a first ESD protection circuit having a first terminal coupled to the second terminal of the SCR, wherein a second terminal of the first ESD protection circuit is coupled to a control terminal of the SCR; and
a second ESD protection circuit having a first terminal coupled to the control terminal of the SCR, wherein a second terminal of the second ESD protection circuit is coupled to the first pad.

13. The ESD protection apparatus of claim 12, wherein the first terminal of the SCR is an anode, and the second terminal of the SCR is a cathode.

14. The ESD protection apparatus of claim 12, wherein the first ESD protection circuit comprises:
a diode having a cathode as the first terminal of the first ESD protection circuit, wherein an anode of the diode serves as the second terminal of the first ESD protection circuit.

15. The ESD protection apparatus of claim 12, wherein the first ESD protection circuit comprises:
a transistor having a first terminal as the first terminal of the first ESD protection circuit, wherein a second terminal and a control terminal of the transistor serve as the second terminal of the first ESD protection circuit.

16. The ESD protection apparatus of claim 12, wherein the second ESD protection circuit comprises:
a diode having a cathode as the first terminal of the second ESD protection circuit, wherein an anode of the diode serves as the second terminal of the second ESD protection circuit.

17. The ESD protection apparatus of claim 12, wherein the second ESD protection circuit comprises:
a transistor having a first terminal as the first terminal of the second ESD protection circuit, wherein a second terminal and a control terminal of the transistor serve as the second terminal of the second ESD protection circuit.

18. The ESD protection apparatus of claim 12, wherein the second ESD protection circuit comprises:
a first diode having a cathode as the first terminal of the second ESD protection circuit; and
a second diode having an anode coupled to an anode of the first diode, wherein a cathode of the second diode serves as the second terminal of the second ESD protection circuit.

19. The ESD protection apparatus of claim 12, wherein the second ESD protection circuit comprises:
a first transistor having a first terminal as the first terminal of the second ESD protection circuit; and
a second transistor having a first terminal and a control terminal coupled to a second terminal and a control terminal of the first transistor, wherein a second terminal of the second transistor serves as the second terminal of the second ESD protection circuit.

20. The ESD protection apparatus of claim 12, wherein the second ESD protection circuit comprises:
a first diode having a cathode as the first terminal of the second ESD protection circuit;
a second diode having an anode coupled to an anode of the first diode; and
a third diode having an anode coupled to a cathode of the second diode, wherein a cathode of the third diode serves as the second terminal of the second ESD protection circuit.

21. The ESD protection apparatus of claim 12, wherein the second ESD protection circuit comprises:
a first transistor having a first terminal as the first terminal of the second ESD protection circuit;
a second transistor having a first terminal and a control terminal coupled to a second terminal and a control terminal of the first transistor; and
a third transistor having a first terminal and a control terminal coupled to a second terminal of the second transistor, wherein a second terminal of the third transistor serves as the second terminal of the second ESD protection circuit.

22. The ESD protection apparatus of claim 12, wherein the second ESD protection circuit comprises:
a diode having an anode as the first terminal of the second ESD protection circuit, wherein a cathode of the diode serves as the second terminal of the second ESD protection circuit.

23. The ESD protection apparatus of claim 12, wherein the second ESD protection circuit comprises:
a transistor having a first terminal and a control terminal as the first terminal of the second ESD protection circuit, wherein a second terminal of the transistor serves as the second terminal of the second ESD protection circuit.

24. The ESD protection apparatus of claim 12, wherein the first pad is a power voltage pad or a reference voltage pad, and the second pad is a signal pad.

* * * * *